United States Patent
Hong (10) Patent No.: US 6,973,609 B2
(45) Date of Patent: Dec. 6, 2005

(54) SCAN CELL CIRCUIT AND SCAN CHAIN CONSISTING OF SAME FOR TEST PURPOSE

(75) Inventor: Ted Hong, Taipei (TW)

(73) Assignee: VIA Technologies, Inc, (TW)

( * ) Notice: Subject to any disclaimer, the term of this patent is extended or adjusted under 35 U.S.C. 154(b) by 463 days.

(21) Appl. No.: 10/196,897

(22) Filed: Jul. 16, 2002

(65) Prior Publication Data

US 2003/0135803 A1 Jul. 17, 2003

(30) Foreign Application Priority Data

Jan. 17, 2002 (TW) .............................. 91100663 A (51) Int. Cl.[7] .......................................... G01R 31/28
(52) U.S. Cl. ...................... 714/726; 714/724; 714/742
(58) Field of Search ............................ 714/726, 724, 714/727, 742, 70, 731

(56) References Cited

U.S. PATENT DOCUMENTS

| | | | |
|---|---|---|---|
| 6,266,801 B1 * | 7/2001 | Jin ................................ | 716/8 |
| 6,314,539 B1 * | 11/2001 | Jacobson et al. ............ | 714/727 |
| 6,442,721 B2 * | 8/2002 | Whetsel ....................... | 714/726 |
| 6,446,230 B1 * | 9/2002 | Chung ......................... | 714/726 |
| 6,578,168 B1 * | 6/2003 | Parulkar et al. ............. | 714/727 |
| 6,611,934 B2 * | 8/2003 | Whetsel, Jr. ................. | 714/727 |

* cited by examiner

Primary Examiner—Albert Decady
Assistant Examiner—Fritz Alphonse
(74) Attorney, Agent, or Firm—Volpe & Koenig, P.C.

(57) ABSTRACT

A scan cell circuit for use in an integrated circuit chip is disclosed. The scan cell circuit includes a multiplexer receiving a first signal, a second signal and a selection signal, and outputting one of the first signal and the second signal in response to the selection signal, and a host circuit electrically connected to the multiplexer, receiving and processing an output of the multiplexer, and proceeding an optional output from a first output end and/or a second output end. When the multiplexer selects the second signal to be outputted in response to a specific state of the selection signal, the first signal output end is fixed at a constant level according to the specific state of the selection signal.

20 Claims, 7 Drawing Sheets

SCAN CELL CIRCUIT AND SCAN CHAIN CONSISTING OF SAME FOR TEST PURPOSE

FIELD OF THE INVENTION

The present invention relates to a scan cell circuit and a scan chain consisting of scan cells for testing, and more particularly to a scan cell circuit and a scan chain consisting of the scan cells for testing an integrated circuit chip.

BACKGROUND OF THE INVENTION

Along with development of integrated circuit (IC) fabrication technology, a number of high density circuit devices with complicated functions can be produced on a single chip. Moreover, owing to the increasing circuit complexity, it becomes more and more important to test the integrated circuit to assure of the normal operation of the integrated circuit. For facilitating the test of the IC, a test circuit exclusively for test purpose is provided in the integrated circuit along with the operating circuits.

Generally, in an automatic test pattern generation (ATPG) method, a lot of scan cells rather than flip-flop circuits are used to increase the circuit controllability and observability and to establish a scan chain for a test procedure. Please refer to FIG. 1 which is a schematic diagram illustrating a typical scan chain 11 disposed in an integrated circuit 10. The scan chain 11 includes a plurality of scan cell circuits 111 connected in series. A test signal is inputted from a signal pin 12 to the scan chain 11. Subsequently, the test signal is outputted from another signal pin 13 to determine whether the relative circuits are in normal operation or not.

Figure 1:
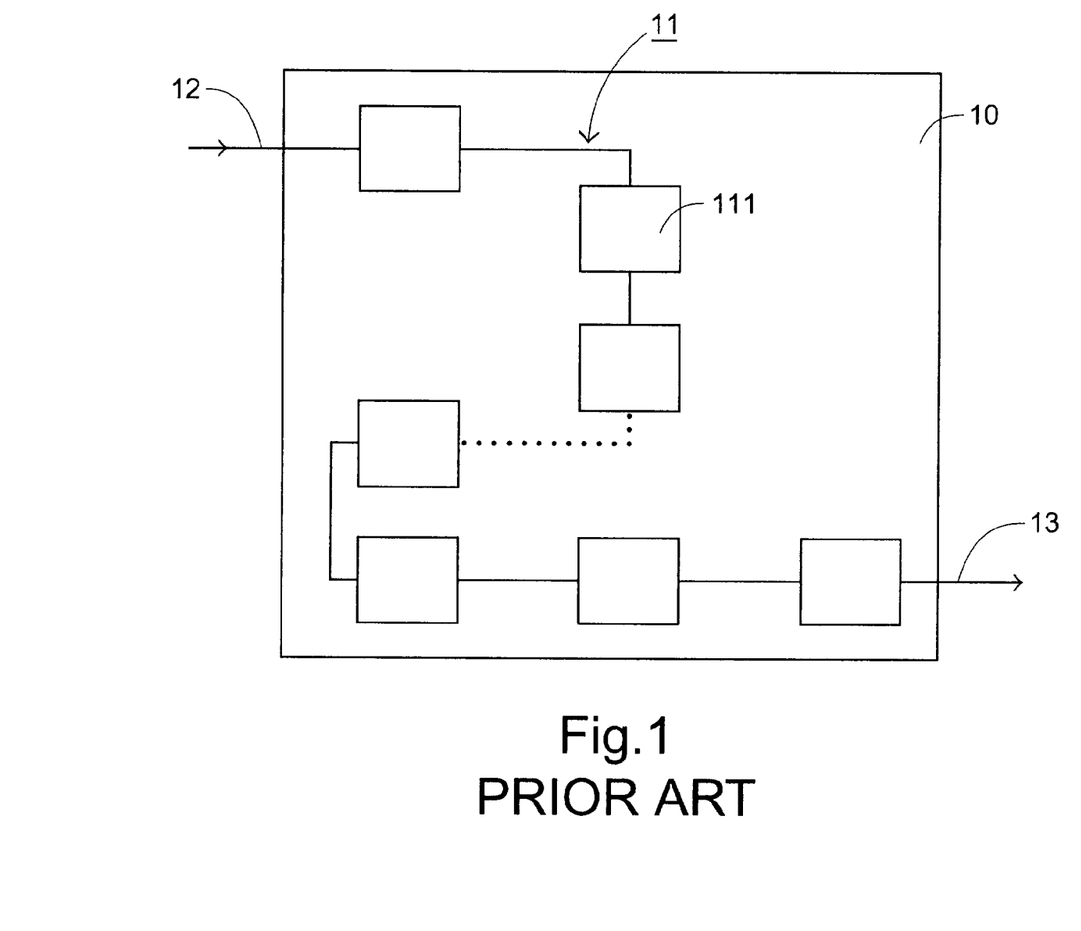
FIG. 1 is a schematic diagram illustrating a typical scan chain disposed in an integrated circuit.
Figure 2:
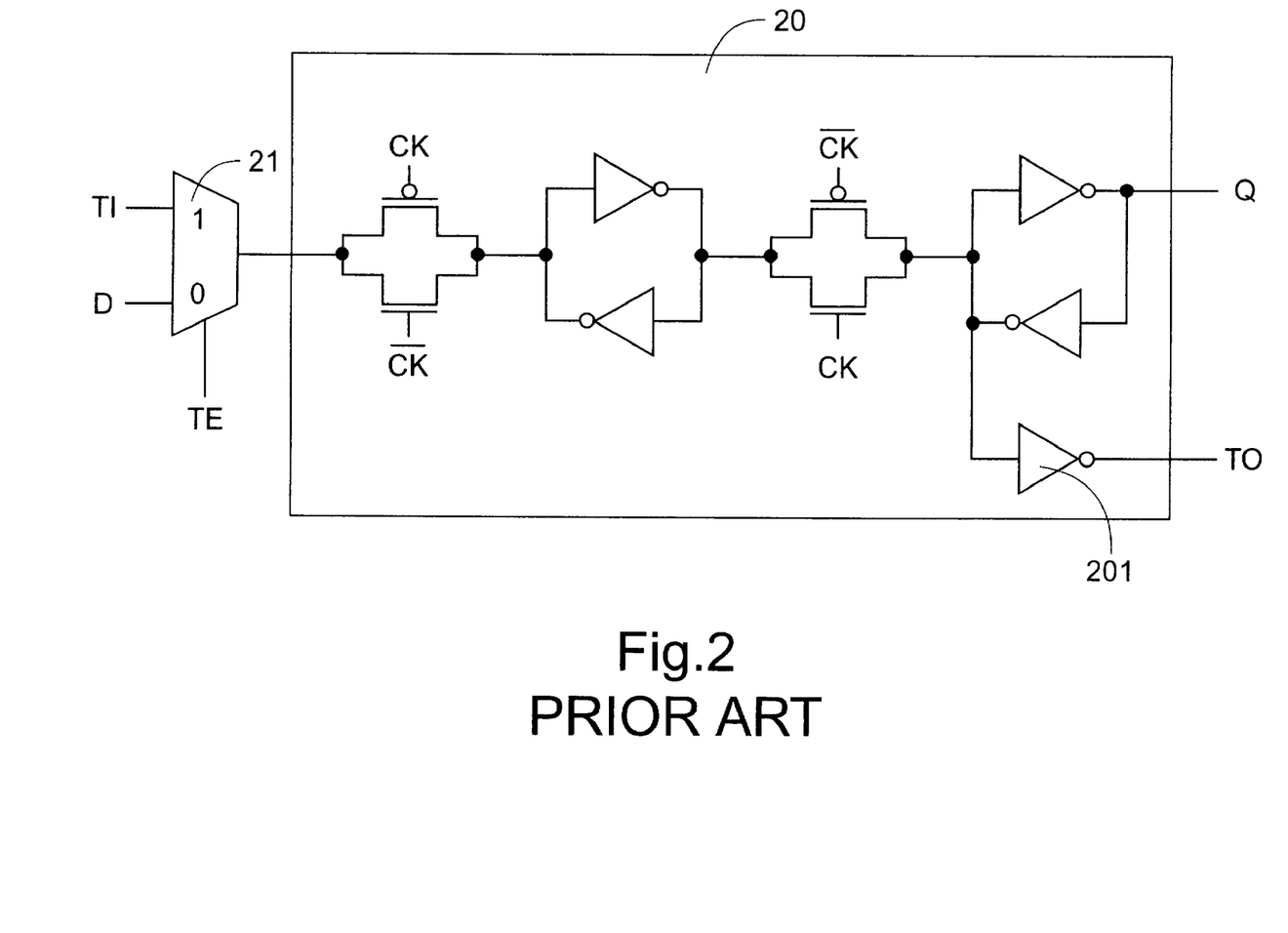
FIG. 2 is a schematic circuit diagram illustrating one of the scan cell circuits of FIG. 1.

Please refer to FIG. 2 which is a schematic circuit diagram illustrating one of the scan cell circuits of FIG. 1. A test signal input end TI of a host circuit 20 is connected to a test signal output end TO of a preceding scan cell circuit (not shown) in series, and a test signal output end TO of the host circuit 20 is connected to another test signal input end TI of the following scan cell circuit (not shown). When the integrated circuit is proceeding the test procedure, a multiplexer 21 selects the signal from the test signal input end TI under the control of a test enable signal TE. After being processed by the host circuit 20, the selected signal passes the test signal output end TO, which is an output end of a NOT gate 201, to be further transmitted to the test signal input end TI of the following scan cell circuit for proceeding the subsequent test procedure. When the integrated circuit is required to enter a normal operation condition, the test enable signal TE should be switched to a low level so that the multiplexer 21 selects the signal from a data signal input end D. The selected signal, after being processed by the host circuit 20, is transmitted out from a data signal output end Q, thereby executing a normal flip-flop operation.

Figure 3:
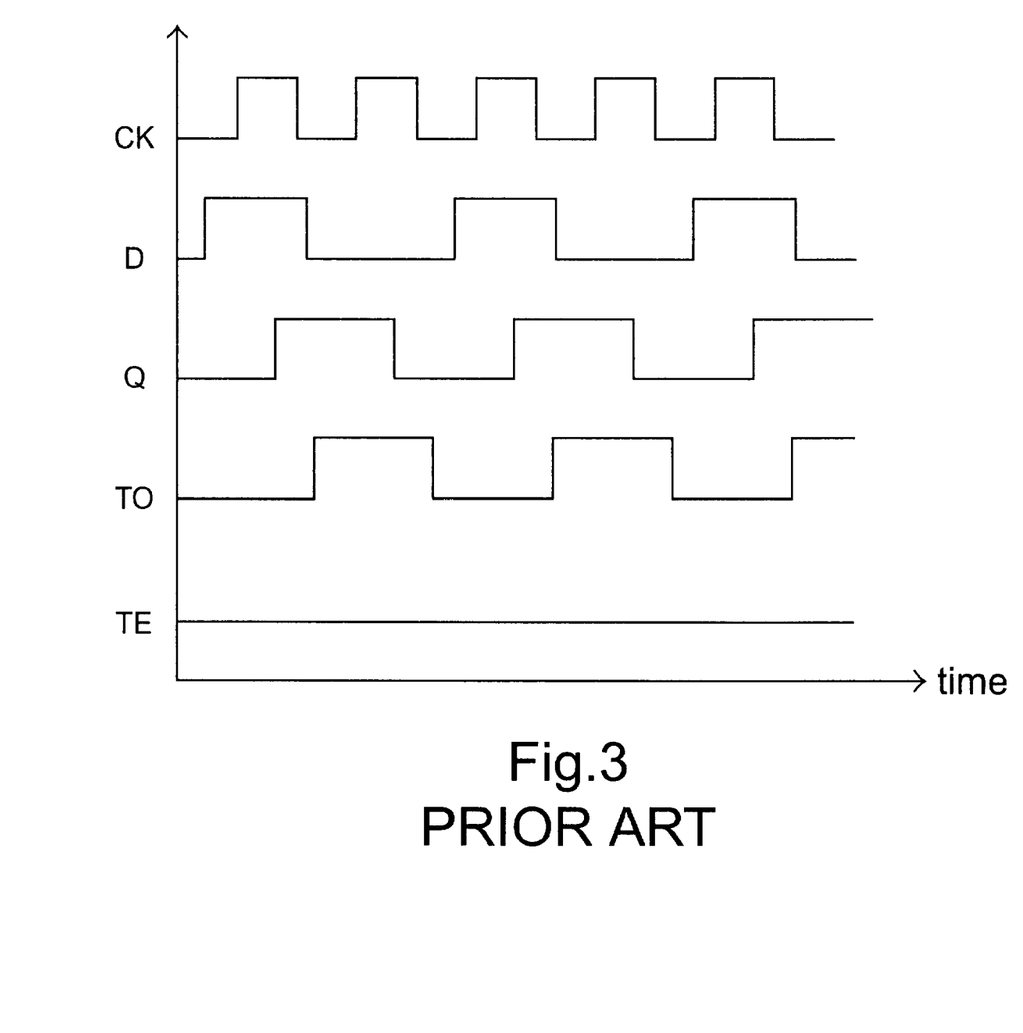
FIG. 3 is a schematic waveform diagram illustrating various signals of the scan cell circuit in FIG. 2 under a normal working condition.

Apparently, the above test signal output end TO is specifically for use in the test procedure, so it has not any function under the normal working condition. The schematic waveform diagram of FIG. 3, however, shows that the test signal output end TO proceeds a level switch with the level switch operation of the data signal output end Q in the prior art circuit even when the IC is in a normal working condition and the signal TE is in a low level. In other words, the level switch number of the test signal output end TO in the prior art circuit under the normal working condition equals to that of the data signal output end Q. According to the low power theory, the more the level switch number is, the more the power consumption of the circuit is. Thus, the design of the prior art circuit does not conform to the demand of low power consumption.

Therefore, the purpose of the present invention is to develop a scan cell circuit and a scan chain consisting of a series of scan cell circuits for testing use in an integrated circuit chip to deal with the above situations encountered in the prior art.

SUMMARY OF THE INVENTION

An object of the present invention is to provide a scan cell circuit that does not require the test signal output end TO perform level-switch with the data signal output end under the normal working condition.

Another object of the present invention is to provide a scan chain including a scan cell circuit that does not require the test signal output end TO perform level-switch with the data signal output end under the normal working condition.

According to an aspect of the present invention, there is provided a scan cell circuit for use in an integrated circuit chip. The scan cell circuit includes a multiplexer receiving a first signal, a second signal and a selection signal, and outputting one of the first signal and the second signal in response to the selection signal, and a host circuit electrically connected to the multiplexer, receiving and processing an output of the multiplexer, and proceeding an optional output from a first output end and/or a second output end. When the multiplexer selects the second signal to be outputted in response to a specific state of the selection signal, the first signal output end is fixed at a constant level according to the specific state of the selection signal.

Preferably, the first and second signals received by the multiplexer are a test signal and a data signal, respectively. The multiplexer outputs the test signal when the selection signal is at a high level and outputs the data signal when the selection signal is at a low level.

Preferably, the first and second output ends of the host circuit are a test signal output end and a data signal output end, respectively. The test signal output end is an output end of a NOR gate. The NOR gate includes an input end for receiving a leveling signal, which is equivalent to, and preferably is a reverse phase signal of the selection signal, to fix an output from the test signal output end at the constant level when the selection signal is at the low level.

Alternatively, the first and second output ends of the host circuit are a test signal output end and a data signal output end, respectively. The test signal output end is an output end of an AND gate. The AND gate includes an input end for receiving a leveling signal, which is equivalent to, and preferably is the selection signal itself, to further fix an output from the test signal output end at the constant level when the selection signal is at the low level.

According to another aspect of the present invention, there is provided a digital circuit for use in an integrated circuit chip, performing both testing and data processing operations. The digital circuit includes a multiplexer receiving a test signal, a data signal and a selection signal, and outputting one of the test signal and the data signal in response to a level state of the selection signal, and a host circuit electrically connected to the multiplexer, receiving the selection signal and an output of the multiplexer, and performing a level switching operation at a test signal output end and/or a data signal output end in response to the level state of the selection signal. When the multiplexer selects the data signal to be outputted in response to a specific level state of the selection signal, the host circuit has a level at the test signal output end fixed, thereby reducing a power consumption of the integrated circuit chip.

Preferably, the multiplexer outputs the test signal when the selection signal is at a high level and outputs the data signal when the selection signal is at a low level.

In an embodiment, the test signal output end is an output end of a NOR gate. The NOR gate includes an input end for receiving a reverse phase signal of the selection signal to fix an output of the test signal output end at a low level when the selection signal is at a low level.

In another embodiment, the test signal output end is an output end of an AND gate, The AND gate includes an input end for receiving the selection signal to fix an output of the test signal output end at a low level when the selection signal is at a low level.

For example, the host circuit can be a scan cell or a flip-flop.

According to a further aspect of the present invention, there is provided a level switch digital circuit for use in an integrated circuit chip. The level switch digital circuit includes a multiplexer receiving a first signal, a second signal and a selection signal, and outputting one of the first signal and the second signal in response to a level state of the selection signal, and a host circuit electrically connected to the multiplexer, receiving the selection signal, receiving and processing an output of the multiplexer, and performing a level switching operation at a first signal output end and/or a second signal output end in response to the level state of the selection signal. When the multiplexer selects the second signal to be outputted in response to a specific state of the selection signal, the host circuit has a level at the first signal output end fixed, thereby reducing a power consumption of the integrated circuit chip.

Preferably, the first and second signals received by the multiplexer are a test signal and a data signal, respectively. The multiplexer outputs the test signal when the selection signal is at a high level and outputs the data signal when the selection signal is at a low level.

In an embodiment, the first and second output ends of the host circuit are a test signal output end and a data signal output end, respectively. The test signal output end is an output end of a NOR gate. The NOR gate includes an input end for receiving a reverse phase signal of the selection signal to fix an output from the test signal output end at the constant level when the selection signal is at the low level.

In another embodiment, the first and second output ends of the host circuit are a test signal output end and a data signal output end, respectively. The test signal output end is an output end of an AND gate. The AND gate includes an input end for receiving the selection signal to further fix an output from the test signal output end at the constant level when the selection signal is at the low level.

According to a further aspect of the present invention, there is provided a scan chain for use in an integrated circuit chip including a plurality of scan cell circuits connected in series and performing both testing and data processing operations. At least one of the scan cell circuits includes a multiplexer receiving a test signal, a data signal and a selection signal, and outputting one of the test signal and the data signal in response to a level state of the selection signal, and a host circuit electrically connected to the multiplexer, receiving the selection signal and an output of the multiplexer, and performing a level switching operation at a test signal output end and/or a data signal output end in response to the level state of the selection signal. When the multiplexer selects the data signal to be outputted in response to a specific level state of the selection signal, the host circuit has a level at the test signal output end fixed, thereby reducing a power consumption of the integrated circuit chip.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 4A:
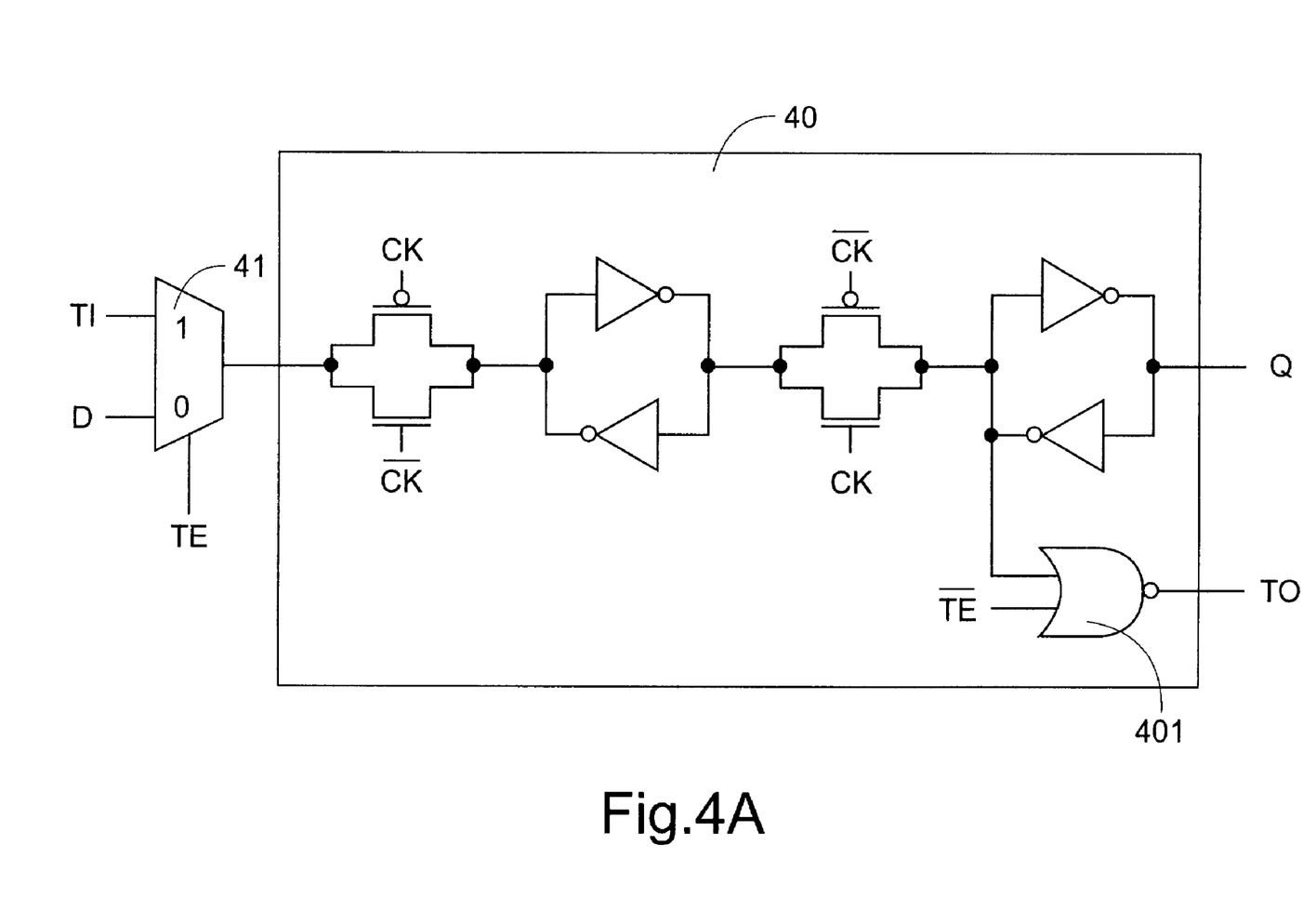
FIG. 4A is a schematic circuit diagram illustrating a preferred embodiment of a scan cell circuit according to the present invention.
Figure 4B:
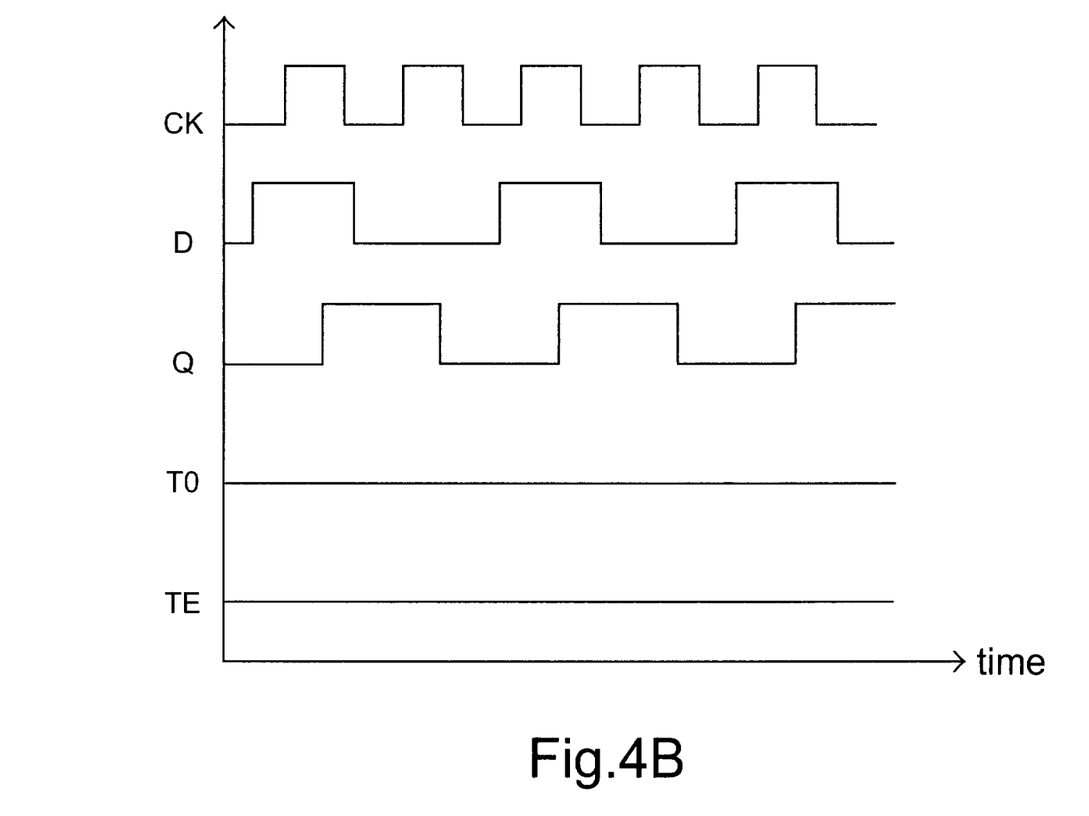
FIG. 4B is a schematic waveform diagram illustrating various signals of the scan cell circuit in FIG. 4A under a normal working condition.

Please refer to FIG. 4A which is a schematic circuit diagram illustrating a preferred embodiment of a scan cell circuit according to the present invention. The scan cell circuit is used in an integrated circuit chip for test purpose. As shown in FIG. 4A, the scan cell circuit includes a multiplexer 41 and a host circuit 40. The multiplexer 41 receives a test signal TI, a data signal D and a selection signal TE. The host circuit 40 includes a data signal output end Q and a test signal output end TO. The test signal output end TO is an output end of an NOR gate 401 that has input ends receiving the processed output from the multiplxer 41, and a reverse phase signal $\overline{TE}$ of the selection signal TE functioning as a leveling signal. When the selection signal TE is at a high level, i.e. logic "1", the test signal TI is outputted for a testing procedure. On the other hand, when the selection signal TE is at a low level, i.e. logic "0", the data signal D is outputted for a normal working procedure. When the integrated circuit chip is proceeding a test procedure, the selection signal TE is switched to the high level so that the multiplexer 41 selects the test signal TI to be outputted to the host circuit 40. Meanwhile, the reverse phase signal $\overline{TE}$ is at a low level, i.e. logic "0". Therefore, the test signal output end TO will expectedly output the test signal to proceed the subsequent test procedure according to the NOR truth table. That is, level switching operations are desiredly proceeded at the test signal output end TO for test purpose. On the other hand, when the integrated circuit is required to enter a normal operation condition, the section signal TE is switched into the low level, and the data signal D is selected by the multiplexer 41 to be processed by the host circuit 40 and outputted from the data signal output end Q. It is desirable that the test signal output end TO does not perform any level switch operation at this state. Since the input end of the NOR gate 401 receives a reverse phase signal of the selection signal, i.e. logic "1", the test signal output end TO will steadily output a low level signal according to the NOR truth table. Generally, the voltage of the low level signal is zero. FIG. 4B illustrates various signals of the scan cell circuit at this stage. As shown in FIG. 4B, the test signal output end TO will not proceed any level switch with the level switch operation of the data signal output end Q in the normal working condition as the prior art circuit does. In other words, the test signal output end TO according to the present invention will be fixed at a low level in stead of switching levels along with the data signal output end Q when the test procedure is not required. Thus, the power consumption can be reduced.

Figure 5A:
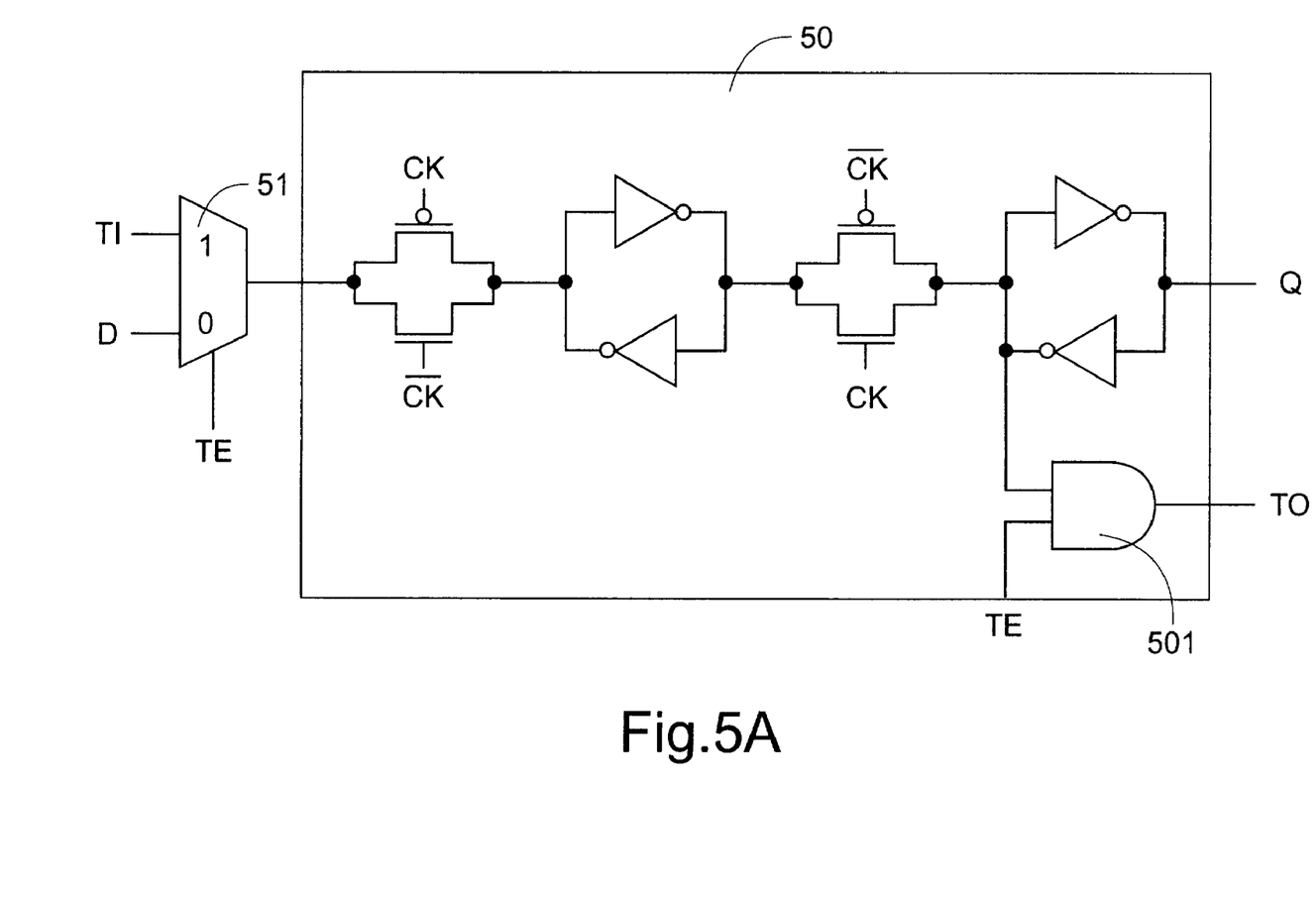
FIG. 5A is a schematic circuit diagram illustrating another preferred embodiment of a scan cell circuit according to the present invention.
Figure 5B:
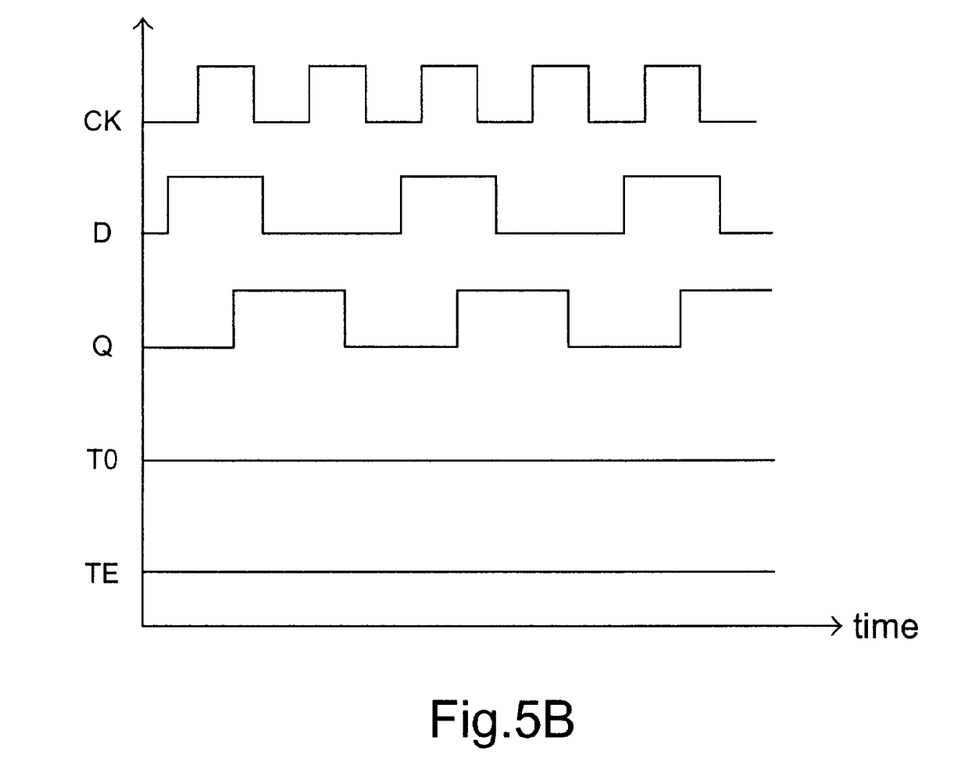
FIG. 5B is a schematic waveform diagram illustrating various signals of the scan cell circuit in FIG. 5A under a normal working condition.

FIG. 5A is a schematic circuit diagram illustrating another preferred embodiment of a scan cell circuit in an integrated circuit chip according to the present invention. The scan cell circuit includes a host circuit 50 and a multiplexer 51. The structures and functions of the host circuit 50 and the multiplexer 51 are similar to those of the host circuit 40 and the multiplexer 41 of FIG. 4A, respectively, except that the NOR gate 401 is replaced by an AND gate 501. In this embodiment, it is the selection signal itself inputted into the AND gate 501 to level the output of the test signal output end TO during the normal working procedure. In the test procedure, the selection signal TE is switched to the high level, and the multiplexer 51 selects the test signal TI to be outputted to the host circuit 50. Since the AND gate 501 includes an input end for receiving the selection signal, which is at the high level, the test signal output end TO will expectedly output the test signal to proceed the subsequent test procedure according to the AND truth table. On the other hand, when the integrated circuit is required to enter a normal operation condition, i.e. the data signal D is to be selected, the selection signal TE is switched into the low level and also provided for the AND gate 501. Since the input end of the NOR gate 501 receives the selection signal, which is at the low level, i.e. logic "0", the test signal output end TO will steadily output a low level signal according to the AND truth table. Generally, the voltage of the low level signal is zero. FIG. 5B is a schematic waveform diagram illustrating various signals of the scan cell circuit in the normal working procedure. As shown in FIG. 5B, the output at the test signal output end TO is kept constant under the normal working condition. Thus, the power consumption can be reduced.

It is to be noted that the selection signal and its reverse phase signal are exemplified as the leveling signals in the embodiments of FIGS. 4A and 5A, respectively, for fixing the test signal output end at a low level when a normal working procedure is performed. Another signal having a level state correlating to the level state of the selection signal or the reverse phase signal, however, can also be referred by the NOR gate or the AND gate to achieve the same purpose.

Moreover, the above power-saving design can be also applied to a flip-flop level switch digital circuit. Therefore, the present invention can be widely used in any level switch digital circuit performing both testing and data processing operations. Accordingly, for a scan chain which includes such scan circuits in series, the level switch operation of the test signal output end TO under the normal working condition is eliminated, resulting in the reduction of the power consumption.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A scan cell circuit for use in an integrated circuit chip, comprising:
    a multiplexer for receiving a first signal, a second signal and a selection signal, and selecting one of said first signal and said second signal to be outputted as an output signal according to said selection signal; and
    a host circuit electrically connected to said multiplexer, for receiving and processing said output signal, and outputting a processed output signal from a first output end in response to said output signal and said selection signal, thereby having said processed output signal fixed at a constant level when said multiplexer selects said second signal to be outputted according to said selection signal.

2. The scan cell circuit according to claim 1 wherein said first and second signals received by said multiplexer are a test signal and a data signal, respectively, and said multiplexer outputs said test signal when said selection signal is at a high level and outputs said data signal when said selection signal is at a low level.

3. The scan cell circuit according to claim 1 wherein said host circuit comprises a NOR gate, and said NOR gate includes an input end for receiving a leveling signal equivalent to a reverse phase signal of said selection signal to fix said processed output signal at said constant level when said selection signal is at said low level.

4. The scan cell circuit according to claim 1 wherein said host circuit comprises an AND gate, and said AND gate includes an input end for receiving a leveling signal equivalent to said selection signal to said processed output signal at said constant level when said selection signal is at said low level.

5. A digital circuit for use in an integrated circuit chip, performing both testing and data processing operations, and comprising:
    a multiplexer for receiving a test signal, a data signal and a selection signal, and selecting one of said test signal and said data signal to be outputted as an output signal according to said selection signal; and
    a host circuit electrically connected to said multiplexer, a test output signal and a data output signal from a test signal output end and a data signal output end, respectively, in response to said output signal and said selection signal, so that when said multiplexer selects said data signal to be outputted according to said selection signal, said test output signal is fixed at a constant level, thereby reducing a power consumption of said integrated circuit chip.

6. The digital circuit according to claim 5 wherein said multiplexer outputs said test signal when said selection signal is at a high level and outputs said data signal when said selection signal is at a low level.

7. The digital circuit according to claim 5 wherein said host circuit comprises a NOR gate, and said NOR gate includes an input end for receiving a reverse phase signal of said selection signal to fix said test output signal at a low level when said selection signal is at a low level.

8. The digital circuit according to claim 5 wherein said host circuit comprises an AND gate, and said AND gate includes an input end for receiving said selection signal to fix said test output signal at a low level when said selection signal is at a low level.

9. The digital circuit according to claim 5 wherein said host circuit is a scan cell.

10. The digital circuit according to claim 5 wherein said host circuit is a flip-flop.

11. A level switch digital circuit for use in an integrated circuit chip, comprising:
   a multiplexer for receiving a first signal, a second signal and a selection signal, and selecting one of said first signal and said second signal to be outputted as an output signal according to said selection signal; and
   a host circuit electrically connected to said multiplexer for receiving and processing said output signal into first and second output signals, and performing a level switching operation of said second output signal while using a leveling signal to have said first output signal fixed at a constant level when said multiplexer selects said second signal to be outputted according to said selection signal.

12. The level switch digital circuit according to claim 11 wherein said first and second signals received by said multiplexer are a test signal and a data signal, respectively, and said multiplexer outputs said test signal when said selection signal is at a high level and outputs said data signal when said selection signal is at a low level.

13. The level switch digital circuit according to claim 11 wherein said end at host circuit comprises a NOR gate, and said NOR gate includes an input end for receiving a reverse phase signal of said selection signal as said leveling signal to fix said first output signal at said constant level when said selection signal is at said low level.

14. The level switch digital circuit according to claim 11 wherein said host circuit comprises an AND gate, and wherein said AND gate includes an input end for receiving said selection signal as said leveling signal fix said first output signal at said constant level when said selection signal is at said low level.

15. The level switch digital circuit according to claim 11 wherein said host circuit is a scan cell.

16. The level switch digital circuit according to claim 11 wherein said host circuit is a flip-flop.

17. A scan chain for use in an integrated circuit chip including a plurality of scan cell circuits connected in series and performing both testing and data processing operations, wherein at least one of said scan cell circuits comprises:
   a multiplexer for receiving a test signal, a data signal and a selection signal, and selecting one of said test signal and said data signal to be outputted as an output signal according to to a level state of said selection signal; and
   a host circuit electrically connected to said multiplexer, for receiving and processing said selection signal and said output signal into test and data output signals, and performing a level switching operation of said data output signal while using a leveling signal to have said test output signal fixed at a constant level when said multiplexer selects said data signal to be outputted according to said selection signal, thereby reducing a power consumption of said integrated circuit chip.

18. The scan chain according to claim 17 wherein said multiplexer outputs said test signal when said selection signal is at a high level and outputs said data signal when said selection signal is at a low level.

19. The scan chain according to claim 17 wherein host circuit comprises a NOR gate, and said NOR gate includes an input end for receiving a reverse phase signal of said selection signal as said leveling signal to fix said test output signal at a low level when said selection signal is at a low level.

20. The scan chain according to claim 17 wherein said host circuit comprises an AND gate, and said AND gate includes an input end for receiving said selection signal as said leveling signal to fix said test output signal at a low level when said selection signal is at a low level.

* * * * *